United States Patent [19]

Song

[11] Patent Number: 5,614,829
[45] Date of Patent: Mar. 25, 1997

[54] STATE-OF-CHARGE MEASURING METHOD USING MULTILEVEL PEUKERT'S EQUATION

[75] Inventor: Sung-ku Song, Sungnam, Rep. of Korea

[73] Assignee: Y.P. Lee & Associates, Seoul, Rep. of Korea

[21] Appl. No.: 622,350

[22] Filed: Mar. 27, 1996

Related U.S. Application Data

[63] Continuation-in-part of Ser. No. 366,719, Dec. 30, 1994, abandoned.

[30]    Foreign Application Priority Data

Sep. 27, 1994 [KR]  Rep. of Korea .................. 94-24356

[51] Int. Cl.$^6$ ............................................. G01N 27/416
[52] U.S. Cl. ........................... 324/427; 324/433; 320/48; 364/483
[58] Field of Search ......................... 324/426, 427, 324/428, 430, 431, 432, 433, 434; 320/48; 340/636; 364/483

[56]    References Cited

U.S. PATENT DOCUMENTS

| | | | |
|---|---|---|---|
| 3,886,442 | 5/1975 | Chiku et al. | 324/427 |
| 4,390,841 | 6/1983 | Martin et al. | 324/427 |
| 4,558,281 | 12/1985 | Codd et al. | 324/427 X |
| 4,595,880 | 6/1986 | Patil | 324/427 |
| 4,952,862 | 8/1990 | Biagetti et al. | 320/48 |
| 5,349,540 | 9/1994 | Birkle et al. | 324/427 X |
| 5,488,300 | 1/1996 | Jamieson | 324/432 |

*Primary Examiner*—Kenneth A. Wieder
*Assistant Examiner*—Diep Do
*Attorney, Agent, or Firm*—Lowe, Price, LeBlanc & Becker

[57]    ABSTRACT

The method of measuring the state-of-charge of a battery by using multilevel Peukert's equation which is different from conventional Peukert's equation in such a way that the conventional Peukert's equation uses only two reference points to obtain Peukert's constants whereas the multilevel Peukert's equation uses a third reference point to obtain two sets of Peukert's constants. By doing so, the state-of-charge of a battery can be measured more precisely and the reliability of a battery powered product can be enhanced.

2 Claims, 3 Drawing Sheets

1

STATE-OF-CHARGE MEASURING METHOD USING MULTILEVEL PEUKERT'S EQUATION

This application is a Continuation-in-Part of U.S. Ser. No. 08/366,719, filed Dec. 30, 1994, abandoned.

BACKGROUND OF THE INVENTION

The present invention relates to a state-of-charge measuring method, and more particularly, to a state-of-charge measuring method using multilevel Peukert's equation for battery-powered products such as electric vehicles.

Accurate battery state-of-charge information is very important for the driver of an electric vehicle since, by knowing the exact amount of energy available from the batteries, the driver of the vehicle can travel without the fear of running out of energy before reaching the destination.

The state-of-charge of a battery is a function of used capacity and available energy. The used capacity can be easily calculated by simply multiplying the average discharge current and total time. On the other hand, determining the available energy of a battery is not straightforward because the available energy depends on the magnitude of the average discharge current. Low average discharge current increases the available energy, and high average discharge current decreases the available energy. And therefore, to calculate the available energy accurately, a sophisticated algorithm such as Peukert's equation must be used. In other words, to measure the state-of-charge of a battery accurately, the usage pattern such as driving profile must be taken into account.

There exist many methods for measuring battery state-of-charge. They include open-circuit voltage check, measurement of electrolyte's specific gravity, measurement of current under load and current accumulation (ampere-hour or Ah) method to name a few. However, all of the above methods do not take into account the usage pattern, and therefore, are susceptible to a large degree of error.

As mentioned earlier, one method that takes into account the usage pattern in determining the state-of-charge of a battery is Peukert's equation. Peukert's equation is used in conjunction with Ah method to reduce error. By using Peukert's equation, the available energy of a battery can be calculated with good accuracy, and consequently, the state-of-charge can be determined more precisely.

In a conventional method using Peukert's equation, the usage range of a battery is established and the maximum ($I_H$) and minimum currents ($I_L$) are set according to the battery's usage range, and Peukert's constants (n and K) are obtained by using the maximum and minimum currents. Peukert's equation calculates the available capacity (Ah_available) of a battery as follows:

$$Ah\_available = K I_{avg}^{(1-n)}$$

where n and K are Peukert's constants and $I_{avg}$ is the average discharge current. The constants n and K are found as follows:

$$n = \frac{\log \frac{t_L}{t_H}}{\log \frac{I_H}{I_L}}$$

and $$K = I_H^n t_H = I_L^n t_L$$

where $I_H$ and $I_L$ represent upper and lower current values, respectively, of the current range in which a battery is normally operated and $t_H$ and $t_L$ are discharge times at $I_H$ and $I_L$, respectively. Using Peukert's equation, the state-of-charge of a battery is calculated as illustrated in FIG. 1. Referring to FIG. 1, in step 101, discharge current I(t) is read. In step 102, the average discharge current ($I_{avg}$) is calculated by using equation (1).

$$I_{avg} = \frac{\int_0^t I(t)dt}{t} \quad (1)$$

In step 103, the capacity drawn from the battery (Ah_used) is calculated by using equation (2) and in step 104, the available capacity (Ah available) is calculated by using equation (3)

$$Ah\_used = I_{avg} \times t \quad (2)$$

$$Ah\_available = K I_{avg}^{(1-n)} \quad (3)$$

Finally in step 105, the state-of-charge is calculated by using equation (4) and the process returns to step 101.

$$\text{State-of-charge} = \left[ 1 - \frac{Ah\_used}{Ah\_available} \right] \times 100 \quad (4)$$

Peukert's equation is a preferred method for applications having widely fluctuating loads such as electric vehicles since it can determine the available capacity under any discharge conditions. However, since the conventional Peukert's equation uses a maximum current $I_H$ and a minimum current $I_L$ as only references, its accuracy deteriorates when the average discharge current is faraway from either $I_H$ or $I_L$ as shown in FIG. 3. Therefore, to improve the accuracy over the entire range, it is necessary to introduce another reference point, i.e., an intermediate $I_M$, between the maximum current $I_H$ and the minimum current $I_L$ as shown in FIG. 3.

SUMMARY OF THE INVENTION

It is an object of the present invention to provide a method in which a third reference point is employed to determine two sets of constants for Peukert's equation, and thereby, measure the state-of-charge of a battery more accurately regardless of the magnitude of the average discharge current.

To accomplish the object of the present invention, there is provided a state-of-discharge measuring method using multilevel Peukert's equation comprising of the following steps: determining two sets of Peukert's constants, one set using low current ($I_L$) and intermediate current ($I_M$) for calculating the state-of-charge when the average discharge current is on the low side, and the other set using high current ($I_H$) and intermediate current ($I_m$) for calculating the state-of-charge when the average discharge current is on the high side; calculating the average discharge current and the capacity used; classifying the discharge current as low or high to determine which set of Peukert's constants to use for calculating the available capacity; calculating the available capacity; and calculating the state-of-charge.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

The present invention employs an algorithm based on Peukert's equation in which a low current $I_L$, an intermediate current $I_M$ and a high current $I_H$ are used for obtaining two sets of Peukert's constants whereas the conventional Peukert's equation uses only minimum and maximum currents, $I_L$ and $I_H$, respectively for obtaining a single set of Peukert's constants. Here, since it is very rare for the magnitude of the average discharge current to fall outside a predetermined range, the algorithm excludes such cases.

Figure 1:
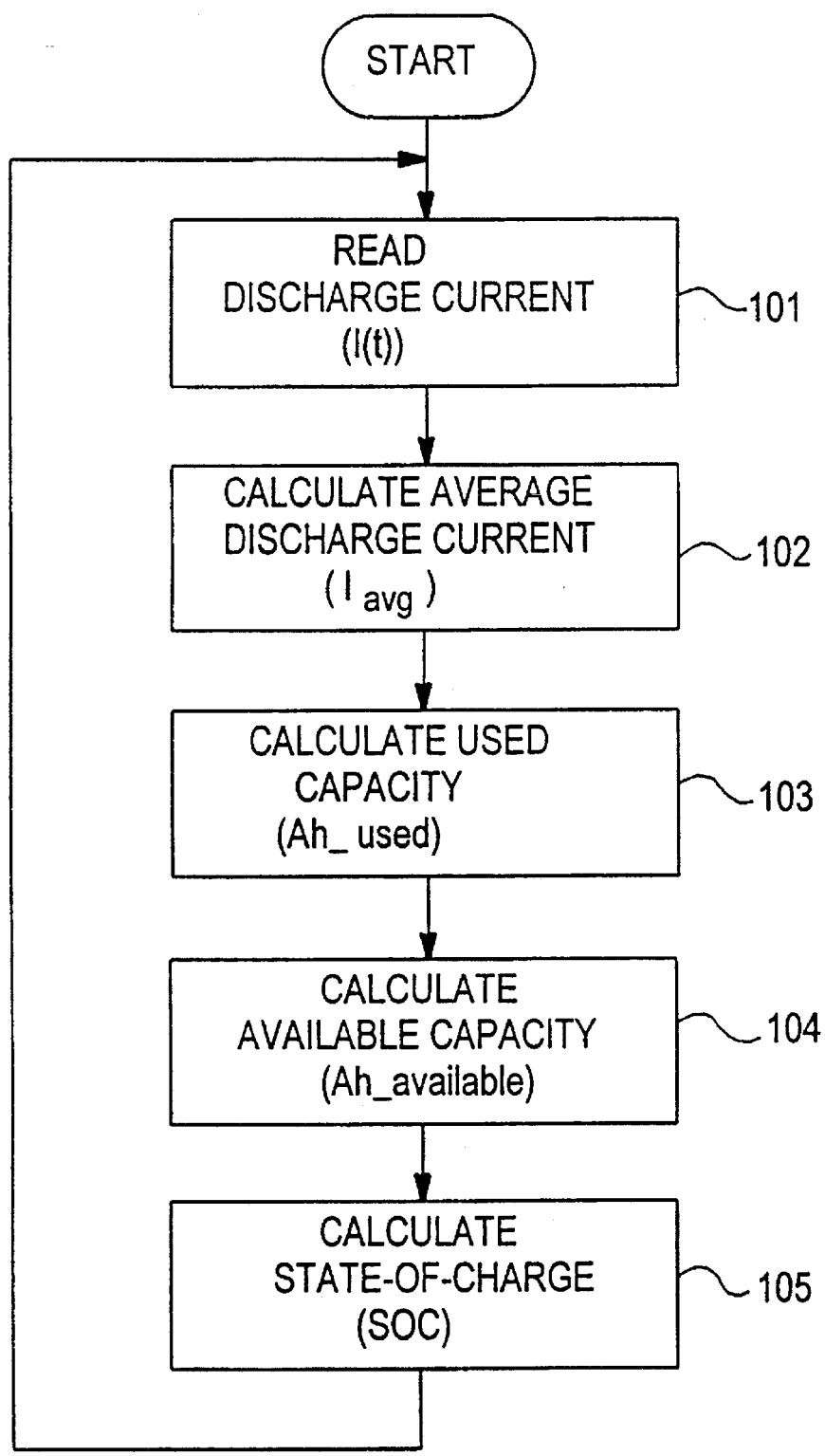
FIG. 1 is a flowchart for explaining a conventional Peukert's equation method of measuring the state-of-charge of a battery.
Figure 2:
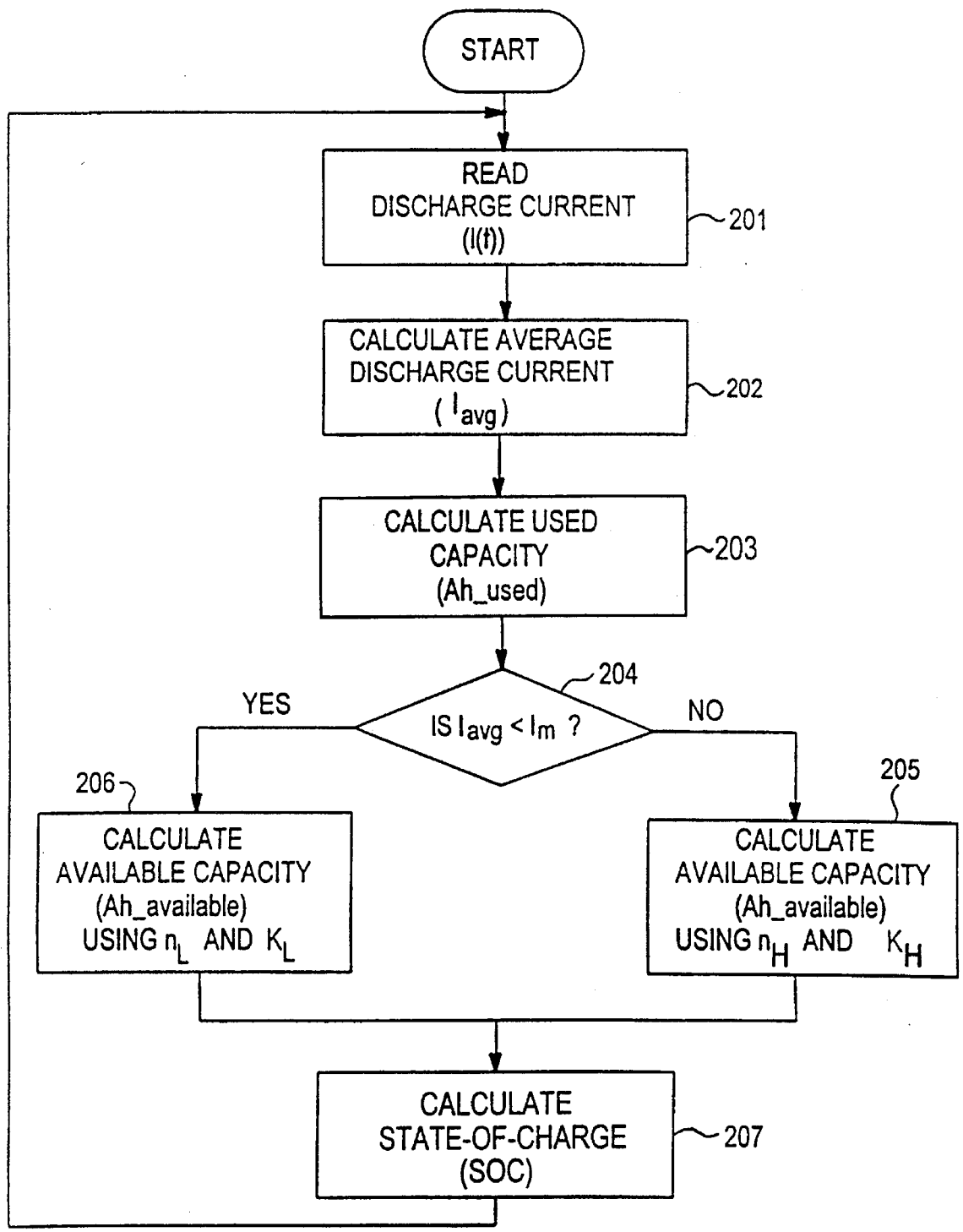
FIG. 2 is a flowchart for explaining a method of measuring the state-of-charge of a battery according to the present invention.

Using the modified Peukert's equation of the present invention, the state-of-charge of a battery is calculated as illustrated in FIG. 2. Referring to FIG. 2, in step 201, discharge current I(t) is measured from a battery. In step 202, the average discharge current ($I_{avg}$) is obtained by using equation (5).

$$I_{avg} = \frac{\int_0^t I(t)dt}{t} \quad (5)$$

In step 203, the capacity drawn from the battery (Ah_used) is calculated by using equation (6). And in step 204, the average discharge current $I_{avg}$ is compared with the intermediate current $I_M$ to determine whether $I_{avg}$ is below or above the intermediate current. In step 205, if the average current is higher than $I_M$, constants $n_H$ and $K_H$ are used, and in step 206, if the average current is lower than the intermediate current $I_m$, constants $n_L$ and $K_L$ are used to calculate the available capacity (A_available) by using equation (7).

$$Ah\_used = I_{avg} \times t \quad (6)$$

$$Ah\_available = K_x I_{avg}^{(1-n)} \quad (7)$$

where $n_x = n_L$ or $n_H$ and $K_x = K_L$ or $K_H$ depending on the magnitude of $I_{avg}$.

The constants $n_L$ and $K_L$ are obtained by using the current values for the minimum current and the intermediate current, and the constants $n_H$ and $K_H$ are obtained by using the current values of the maximum current and the intermediate current.

Finally, in step 207, the state-of-charge is obtained by using equation (8) and the process returns to step 201.

$$\text{State-of-charge} = \left[ 1 - \frac{Ah\_used}{Ah\_available} \right] \times 100 \quad (8)$$

Figure 3:
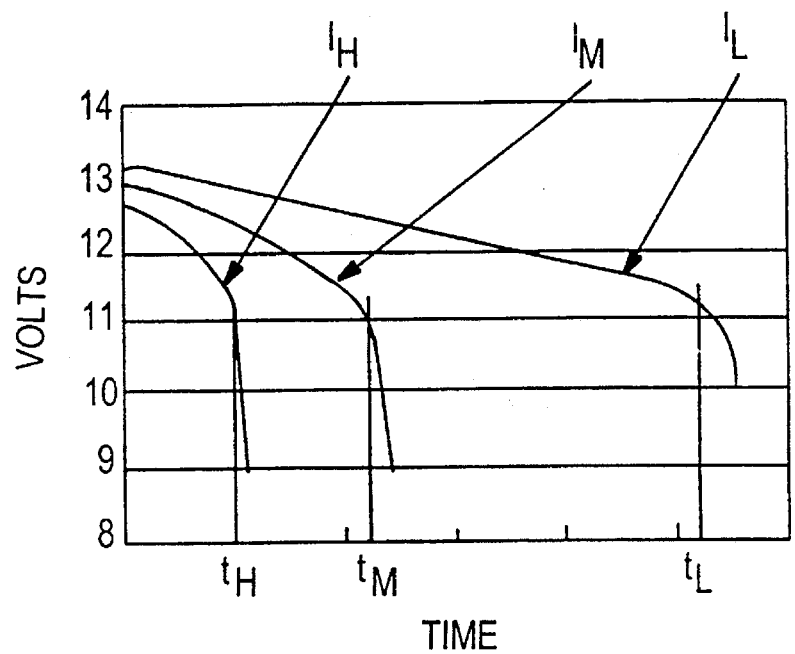
FIG. 3 is a graph explaining how Peukert's constants for use with multilevel Peukert's equation are obtained.

The constants $n_L$, $n_H$, $k_1$ and $k_H$ for equation (7) are calculated as follows.

$$n_L = \frac{\log \frac{t_L}{t_M}}{\log \frac{I_M}{I_L}}$$

$$K_L = I_L{}^{n_L} t_L = I_M{}^{n_M} t_M,$$

and $$n_H = \frac{\log \frac{t_M}{t_H}}{\log \frac{I_H}{I_M}}$$

$$K_H = I_M{}^{n_M} t_m = I_H{}^{n_M} t_H,$$

and where $I_L$, $-I_m$, $I_H$, $t_l$, and $t_h$ obtained from the graph of FIG. 3.

FIG. 3 shows an experimental data obtained by the inventor. Generally, for an electric vehicle battery, C/5 current (a current value which will completely discharge the battery in 5 hours) is used for $I_L$, and 1C current (a current value which will completely discharge the battery in 1 hour) is used for $I_H$, where C is the capacity value measured from the battery. $I_M$ should be chosen so that the overall error is minimized.

Figure 4:
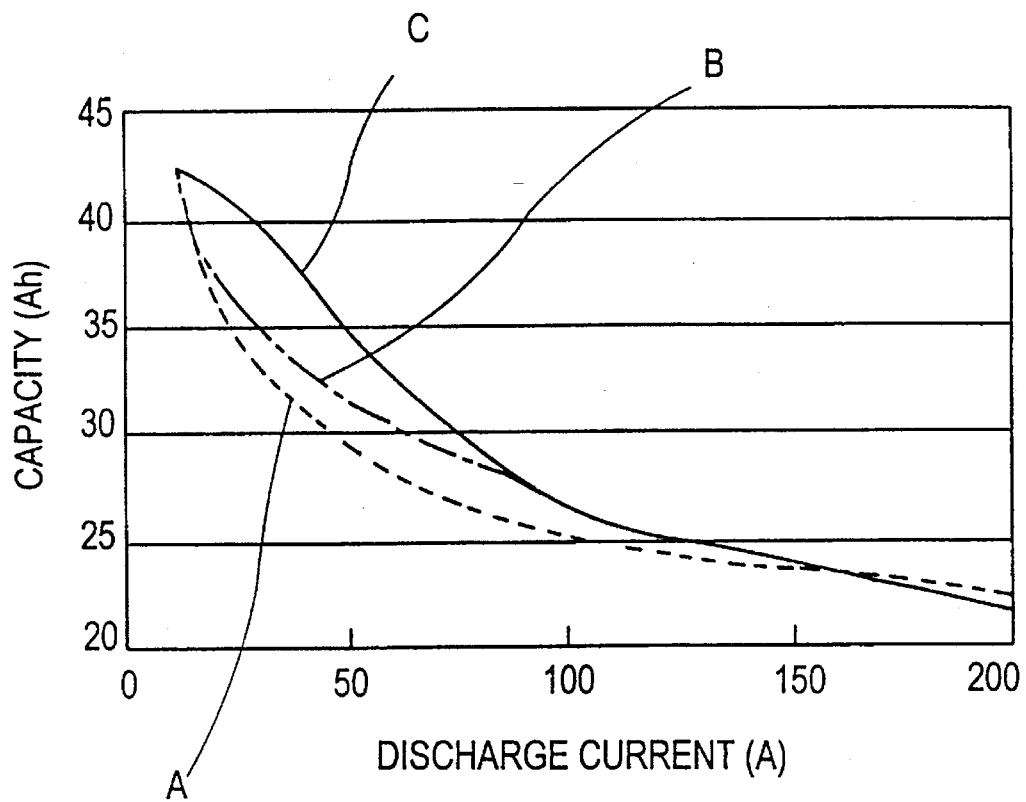
FIG. 4 is a graph showing errors associated with the conventional Peukert's equation and multilevel Peukert's equation.

Referring to FIG. 4, the graph shows the difference between the capacity calculated using conventional Peukert's equation A and the capacity calculated using multilevel Peukert's equation B in comparison to the experimental capacity C.

What is claimed is:

1. A state-of-charge measuring method using multilevel Peukert's equation comprising the steps of:

a) determining two sets of Peukert's constants, a first set for calculating the state-of-charge when an average discharge current is on a lower side, and a second set for calculating the state-of-charge when the average discharge current is on a higher side;

b) measuring a discharge current from a battery;

c) calculating an average discharge current using said discharge current;

d) calculating a used capacity from said average discharge current;

e) comparing said average discharge current to an intermediate current;

f) classifying said average discharge current as said lower or higher side to determine which set of Peukert's constants to use;

g) obtaining an available capacity using the set of Peukert's constants obtained from said step f); and h) determining the state-of-charge using said used capacity and said available capacity.

2. A state-of-charge measuring method using multilevel Peukert's equation as claimed in claim 1, wherein said determining two sets of Peukert's constants comprising the steps of:

calculating said first set of Peukert's constants for said average discharge current using a minimum current and said intermediate current; and calculating the second set of Peukert's constants for said average discharge current using a maximum current and said intermediate current.

\* \* \* \* \*